United States Patent
Shum et al.

(10) Patent No.: US 9,564,575 B2
(45) Date of Patent: Feb. 7, 2017

(54) DUAL ENCAPSULATION INTEGRATION SCHEME FOR FABRICATING INTEGRATED CIRCUITS WITH MAGNETIC RANDOM ACCESS MEMORY STRUCTURES

(71) Applicant: GLOBALFOUNDRIES Singapore Pte. Ltd., Singapore (SG)

(72) Inventors: Danny Pak-Chum Shum, Singapore (SG); Hai Cong, Singapore (SG); Yi Jiang, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 65 days.

(21) Appl. No.: 14/586,415

(22) Filed: Dec. 30, 2014

(65) Prior Publication Data

US 2016/0190432 A1    Jun. 30, 2016

(51) Int. Cl.

| | |
|---|---|
| *H01L 43/08* | (2006.01) |
| *H01L 43/12* | (2006.01) |
| *H01L 27/22* | (2006.01) |
| *H01L 43/02* | (2006.01) |

(52) U.S. Cl.
CPC ............. *H01L 43/02* (2013.01); *H01L 27/222* (2013.01); *H01L 43/08* (2013.01); *H01L 43/12* (2013.01)

(58) Field of Classification Search
CPC ......... H01L 27/222; H01L 43/08; H01L 43/12
USPC ........................................................ 257/427
See application file for complete search history.

(56) References Cited

U.S. PATENT DOCUMENTS

| | | | |
|---|---|---|---|
| 2004/0032010 A1* | 2/2004 | Kools | H01L 27/222 257/659 |
| 2008/0205126 A1* | 8/2008 | Kajiyama | G11C 11/16 365/158 |
| 2011/0233696 A1* | 9/2011 | Li | G11C 11/5607 257/421 |

(Continued)

OTHER PUBLICATIONS

Embedded MRAM Process, Everspin Technologies the MRAM Company, 1 page, downloaded from www.everspin.com/technology.php?qtype_5, Dec. 30, 2014.

(Continued)

*Primary Examiner* — Jarrett Stark
*Assistant Examiner* — Charles N Ausar-El
(74) *Attorney, Agent, or Firm* — Lorenz & Kopf, LLP (57) ABSTRACT

Integrated circuits with magnetic random access memory (MRAM) and dual encapsulation for double magnesium oxide tunnel barrier structures and methods for fabricating the same are disclosed herein. As an illustration, an integrated circuit includes a magnetic random access memory structure that includes a bottom electrode that has a bottom electrode width and has bottom electrode sidewalls and a fixed layer overlying the bottom electrode that has a fixed layer width that is substantially equal to the bottom electrode width and has fixed layer sidewalls. The MRAM structure of the integrated circuit further includes a free layer overlying a central area of the fixed layer. Still further, the MRAM structure of the integrated circuit includes a first encapsulation layer disposed along the free layer sidewalls and a second encapsulation layer disposed along the bottom electrode sidewalls and the fixed layer sidewalls.

14 Claims, 6 Drawing Sheets

(56) References Cited

U.S. PATENT DOCUMENTS

| | | | | |
|---|---|---|---|---|
| 2013/0032775 A1* | 2/2013 | Satoh | ............... | H01L 45/04 257/1 |
| 2013/0119494 A1* | 5/2013 | Li | ............... | H01L 43/08 257/421 |
| 2014/0073064 A1* | 3/2014 | Kang | ............... | H01L 43/08 438/3 |
| 2014/0252516 A1* | 9/2014 | Beery | ............... | H01L 43/12 257/421 |
| 2014/0264235 A1* | 9/2014 | Gong | ............... | H01L 23/5386 257/4 |
| 2015/0207064 A1* | 7/2015 | Lee | ............... | H01L 43/12 438/3 |
| 2015/0263267 A1* | 9/2015 | Kanaya | ............... | H01L 43/08 257/421 |
| 2016/0072045 A1* | 3/2016 | Kanaya | ............... | H01L 43/08 257/427 |
| 2016/0072047 A1* | 3/2016 | Seto | ............... | H01L 43/08 257/421 |
| 2016/0072050 A1* | 3/2016 | Yoshikawa | ............... | H01L 43/08 257/421 |
| 2016/0079519 A1* | 3/2016 | Yoshikawa | ............... | H01L 43/08 257/421 |
| 2016/0104834 A1* | 4/2016 | Toko | ............... | H01L 43/12 257/421 |
| 2016/0133828 A1* | 5/2016 | Lu | ............... | H01L 43/02 257/421 |

OTHER PUBLICATIONS

Oh et al., "On-Axis Scheme and Novel MTJ Structure for Sub-30nm Gb Density STT-MRAM", IEEE, 2010, pp. 12.6.1-12.6.4.
Slaughter, "Toggle and Spin-Torque MRAM: Status and Outlook", J. Magnetic Society of Japan, 2010, pp. 171-176, v.5.

* cited by examiner

DUAL ENCAPSULATION INTEGRATION SCHEME FOR FABRICATING INTEGRATED CIRCUITS WITH MAGNETIC RANDOM ACCESS MEMORY STRUCTURES

TECHNICAL FIELD

The present disclosure generally relates to integrated circuits and methods for fabricating integrated circuits. More particularly, the present disclosure relates to dual encapsulation integration scheme for fabricating integrated circuits with magnetic random access memory structures.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through an underlying channel between the source and drain regions.

Magnetic random access memory (MRAM) is a non-volatile computer memory technology based on magnetoresistance. MRAM differs from volatile random access memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies that store data as electric charge, MRAM data is stored by magnetoresistive elements. Generally, the magnetoresistive elements are made from two magnetic layers, each of which holds a magnetization. The two magnetic layers are separated from one another by a barrier layer. Together, the two magnetic layers and the barrier layer are referred to as a "magnetic tunnel junction stack" ("MTJ stack"). The magnetization of one of the magnetic layers (the "pinned layer" or "fixed layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Presently-known MRAM structures and methods for fabricating such structures all suffer from several drawbacks. For example, the prior art has experienced difficulties in embedding an MRAM structure into sub-100 nanometer (nm) complementary MOS (CMOS) logic devices with common back-end-of-line (BEOL) interconnects, such as contacts, insulators, metal levels, bonding sites for chip-to-package connections, etc., without substantially impacting yield and reliability. That is, subsequent to performing an etching process used to form the two magnetic layers and the barrier layer, sidewalls of the MTJ stack are exposed. The MTJ stack, having exposed sidewalls, may be damaged during BEOL processing. Furthermore, mobile ions and other contaminants related to the MTJ stack etching process may degrade BEOL inter-level dielectrics (ILDs). Integration is particularly challenging when the MTJ stack is disposed with fine-pitch interconnects (e.g., to achieve smaller memory cells) in conjunction with the ILDs common to sub-100 nm CMOS devices.

Accordingly, it would be desirable to provide integrated circuits and methods for fabricating integrated circuits with MRAM structures that are not susceptible (or are less susceptible) to damage during common BEOL processes. Additionally, it would be desirable to provide integrated circuits and methods for fabricating integrated circuits with MRAM structures that are able to be integrated with fine-pitch (e.g., sub-100 nm) CMOS devices. Furthermore, other desirable features and characteristics of the present disclosure will become apparent from the subsequent detailed description and the appended claims, taken in conjunction with the accompanying drawings and the foregoing technical field and background.

BRIEF SUMMARY

Integrated circuits with magnetic random access memory structures and methods for fabricating integrated circuits with magnetic random access memory structures are disclosed herein. In one exemplary embodiment, an integrated circuit includes a magnetic random access memory (MRAM) structure that includes a bottom electrode that has a bottom electrode width in a width direction and comprises bottom electrode sidewalls that extend in a sidewall direction that is perpendicular to the width direction, a fixed layer overlying the bottom electrode that has a fixed layer width in the width direction that is substantially equal to the bottom electrode width in the width direction and comprises fixed layer sidewalls that extend in the sidewall direction, and a free layer overlying a central area of the fixed layer that has a free layer width in the width direction that is narrower than the bottom electrode width in the width direction and comprises free layer sidewalls that extend in the sidewall direction. The MRAM structure of the integrated circuit further includes a top electrode overlying the free layer that has a top electrode width in the width direction that is substantially equal to the free layer width in the width direction and comprises top electrode sidewalls that extend in the sidewall direction a first encapsulation layer disposed along the free layer sidewalls and the top electrode sidewalls and a second encapsulation layer disposed along the bottom electrode sidewalls and the fixed layer sidewalls.

In another exemplary embodiment, method for fabricating a magnetic random access memory structure of an integrated circuit includes forming a bottom electrode material layer, forming a fixed layer material layer and a first tunnel barrier layer material layer (e.g., of magnesium oxide) over the bottom electrode material layer, forming a free layer material layer over the fixed layer material layer and a second tunnel barrier layer material layer (e.g., of magnesium oxide), and forming a top electrode material layer over the fixed layer material layer. The method further includes removing the free layer material layer and the top electrode material layer from first lateral areas to form a free layer that has a free layer width in a width direction and that comprises free layer sidewalls that extend in a sidewall direction that is perpendicular to the width direction and a top electrode that has a top electrode width in the width direction that is substantially equal to the free layer width in the width direction and that comprises top electrode sidewalls that extend in the sidewall direction. The method further includes forming a first encapsulation layer along the free layer sidewalls and the top electrode sidewalls and over the top electrode and the first tunnel barrier layer material layer, subsequent to forming the first encapsulation layer, removing the bottom electrode material layer and the fixed layer material layer from second lateral areas to form a bottom electrode that has a bottom electrode width in the width direction that is wider than the free layer width in the width direction and that comprises bottom electrode sidewalls that extend in the sidewall direction and a fixed layer that has a fixed layer width in the width direction that is substantially equal to the bottom electrode width in the width direction and that comprises fixed layer sidewalls that extend in the sidewall direction Still further, the method includes forming a second encapsulation layer along the bottom electrode sidewalls and the second tunnel barrier layer material layer and the fixed layer sidewalls.

In yet another exemplary embodiment, an integrated circuit includes a magnetic random access memory structure that includes a bottom electrode that has a bottom electrode width in a width direction and has bottom electrode sidewalls that extend in a sidewall direction that is perpendicular to the width direction and a fixed layer overlying the bottom electrode that has a fixed layer width in the width direction that is substantially equal to the bottom electrode width in the width direction and has fixed layer sidewalls that extend in the sidewall direction. The bottom electrode includes a first conductive material and the fixed layer includes an anti-ferromagnetic material. The MRAM structure of the integrated circuit further includes a free layer overlying a central area of the fixed layer that has a free layer width in the width direction that is narrower than the bottom electrode width in the width direction and has free layer sidewalls that extend in the sidewall direction and a top electrode overlying the free layer that has a top electrode width in the width direction that is substantially equal to the free layer width in the width direction and has top electrode sidewalls that extend in the sidewall direction. The free layer includes a ferromagnetic material and the top electrode includes a second conductive material. Still further, the MRAM structure of the integrated circuit includes a first encapsulation layer disposed along the free layer sidewalls and the top electrode sidewalls and a second encapsulation layer disposed along the bottom electrode sidewalls and the fixed layer sidewalls. The first and second encapsulation layers include a silicon nitride material, and this is dual encapsulation for a double barrier layer magnetic tunnel junction scheme.

BRIEF DESCRIPTION OF THE DRAWINGS

The present disclosure will hereinafter be described in conjunction with the following drawing Figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to integrated circuits with magnetic random access memory structures and methods for fabricating integrated circuits with magnetic random access memory structures. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based memory structures are well-known and so, in the interest of brevity, many conventional steps will only be mentioned briefly herein or will be omitted entirely without providing the well-known process details.

As used herein, it will be understood that when an element or layer, such as an MRAM element or layer, is referred to as being "on," "overlying," "connected to" or "coupled to" another element or layer, it may be directly on, overlying, connected to, or coupled to the other element or layer, or intervening elements or layers may be present. Further, spatially relative terms, such as "beneath," "below," "over," "under," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the MRAM structure in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

As used herein, the term "substantially" refers to the complete, or nearly complete, extent or degree of an action, characteristic, property, state, structure, item, or result. As an arbitrary example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained.

FIGS. 1-13 illustrate, in cross section, integrated circuits with MRAM structures and methods for fabricating integrated circuits with MRAM structures in accordance with exemplary embodiments of the present disclosure. With attention to FIG. 1, the cross-sectional view illustrates a first interlayer dielectric layer (ILD layer) 101 with a first metallization layer 102 disposed within the first ILD layer 101. In one embodiment, the first ILD layer 101 is formed of one or more low-k dielectric materials, un-doped silicate glass (USG), silicon nitride, silicon oxynitride, or other commonly used materials. The dielectric constants (k value) of the low-k dielectric materials may be less than about 3.9, for example, less than about 2.8. The first ILD layer 101 is formed using conventional deposition techniques, which depend on the particular material employed. In an exemplary embodiment, the first ILD layer 101 includes a silicon oxide material and is formed by means of a chemical vapor deposition (CVD) process or a plasma-enhanced CVD process in which tetraethyl orthosilicate (TEOS) is used as a reactant.

Though not illustrated for simplicity in the Figures, the first ILD layer 101 may be formed over an active region of a semiconductor substrate forming part of the integrated circuit. In this regard, the semiconductor substrate may include a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate include transistors (e.g., MOSFETs and/or bipolar junction transistors (BJT)), and/or other suitable elements. These microelectronic elements may be used as selector devices for the disclosed MRAM structures, as is known in the art.

Figure 1:
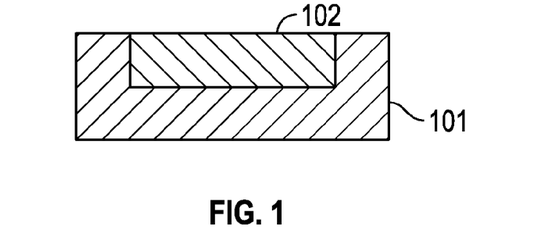
FIGS. 1-13 illustrate, in cross section, integrated circuits with MRAM structures and methods for fabricating integrated circuits with MRAM structures in accordance with exemplary embodiments of the present disclosure.

The first metallization layer 102 includes a conductive material compatible with the particular BEOL processes employed. For example, in one embodiment, the first metallization layer 102 includes a copper material. In this embodiment, the first metallization layer 102 is formed using conventional damascene processes. That is, trenches or cavities for the first metallization layer 102 are formed in the first ILD layer 101. The copper material is then be deposited over the first ILD layer 101 to overfill the trenches or cavities, and the excess copper material is removed by polishing (such as chemical mechanical polishing), such that an upper surface of the first metallization layer 102 and an upper surface of the first ILD layer 101 are substantially co-planar, as illustrated. In another embodiment, the first metallization layer 102 includes a conductive material that does not require damascene processes, such as aluminum. In this embodiment, a layer of an aluminum material may be formed over the first ILD layer 101 and then etched into the desired shape of the first metallization layer 102. Additional ILD material is then deposited alongside the first metallization layer 102 resulting in the structure as shown in FIG. 1. Regardless of the material employed, the first metallization layer 102 may be deposited using conventional deposition techniques, such as physical vapor deposition (PVD).

Figure 2:
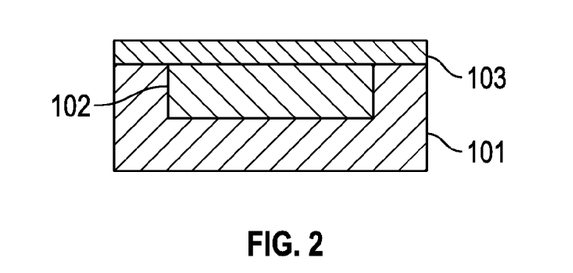

With reference now to FIG. 2, a passivation layer 103 is formed over the upper surfaces of the first metallization layer 102 and the first ILD layer 101. In one embodiment, the passivation layer 103 is formed of a non-organic material selected from un-doped silicate glass (USG), silicon nitride, silicon oxynitride, silicon oxide, or combinations thereof. In an alternative embodiment, the passivation layer 103 is formed of a polymer layer, such as an epoxy, polyimide, benzocyclobutene (BCB), polybenzoxazole (PBO), or the like, although other organic dielectric materials may also be used. In a particular embodiment, the passivation layer 103 is formed of a silicon carbide-based passivation material layer including nitrogen. For example, silicon carbide with nitrogen deposited using CVD from a trimethylsilane source, which is commercially available from Applied Materials (Santa Clara, Calif., USA) under the trade name of BLOK®, is used as the passivation layer 103.

Figure 3:
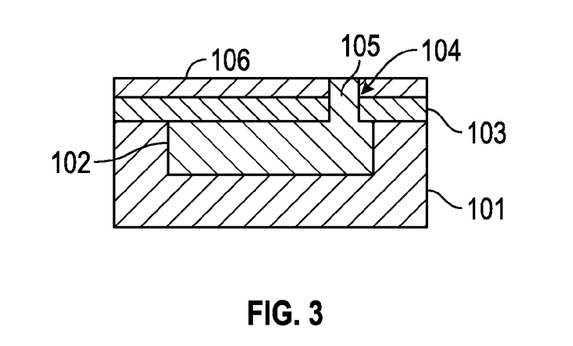

FIG. 3 illustrates the formation of a second ILD layer 106 over the passivation layer 103 and the formation of a conductive via structure 105 through both the passivation layer 103 and the second ILD layer 106. The second ILD layer 106, as with first ILD layer 101, is formed of one or more low-k dielectric materials, USG, silicon nitride, silicon oxynitride, or other commonly used materials. The second ILD layer 106 is formed using conventional deposition techniques, which depend on the particular material employed.

The conductive via structure 105 is formed by etching a trench through the passivation layer 103 and the second ILD layer 106 to expose a portion of the upper surface of the first metallization layer 102 and filling the trench with a conductive material. In this regard, known photolithographic patterning and etching procedures are used to form the trench through the passivation layer 103 and the second ILD layer 106. That is, a photoresist layer (not separately illustrated) is deposited over the second ILD layer 106 and then is exposed to an image pattern and treated with a developing solution to form a pattern opening within the photoresist layer. With the photoresist layer thus patterned, the second ILD layer 106 and the passivation layer 103 are etched to form the trench, which is then filled with the conductive material to form the conductive via structure 105. In one embodiment, the conductive material may be the same material used in to form the first metallization layer 102, such as the copper material or the aluminum material. In other embodiments, the conductive material may be different. Chemical mechanical polishing may be used to remove excess conductive material, such that an upper surface of the conductive via structure 105 and an upper surface of the second ILD layer 106 are substantially co-planar, as illustrated.

Figure 4:
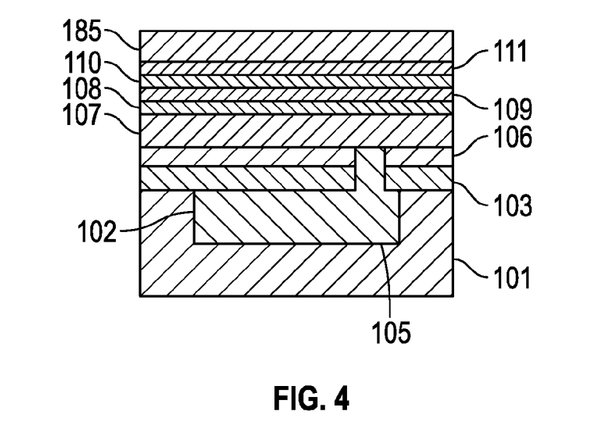

With reference now to FIG. 4, in an exemplary embodiment, a series of material layers 107, 108, 109, 110, 111, and 185 are formed overlying one another. As illustrated, a bottom electrode material layer 107 is formed overlying the upper surfaces of the conductive via structure 105 and the second ILD layer 106, a fixed layer material layer 108 is formed overlying the bottom electrode material layer 107, a first tunnel barrier layer material layer 109 is formed overlying the fixed layer material layer 108, a free layer material layer 110 is formed overlying the first barrier layer material layer 109, a second tunnel barrier layer material layer 111 is formed overlying the free layer material layer 110, and a top electrode material layer 185 is formed overlying the second barrier layer material layer 111. As previously noted, as used herein, the term "overlying" may refer to a direct and abutting overlay, or there may be other layers disposed in between that stated overlying layers. As such, and by way of example, while the top electrode material layer 185 is illustrated in as directly and abuttingly overlying the second barrier layer material layer 111, it will be understood that the top electrode material layer 185 may be considered as overlying any of the material layers 107 through 110 as well. Material layers 108, 109, 110, and 111 form the basis of the MTJ stack of the MRAM structure to be formed. By means of the conductive via structure 105, the bottom electrode material layer 107 is electrically connected to the first metallization layer 102, and thus to the MTJ stack of the MRAM to be formed. The thicknesses of each such layer 107, 108, 109, 110, 111, and 185 will depend on the overall dimensions of the MRAM structure to be formed, as well as the operational parameters of the MRAM structure to be formed, as is known in the art. The processes used for forming such layers are conventional with respect to the particular material selected.

In one embodiment, the bottom electrode material layer 107 includes a conductive material. For example, the bottom electrode material layer 107 may include a conductive metal, such as tantalum, tantalum nitride, or titanium, or a combination of one or more thereof. The fixed layer material layer 108 includes an anti-ferromagnetic material. For example, the fixed layer material layer 108 may include a metal alloy such as platinum manganese (PtMn), iridium manganese (IrMn), nickel manganese (NiMn), or iron manganese (FeMn), or a combination of one or more thereof. It will be appreciated that the fixed layer material layer 108 could include multiple layers such as a synthetic anti-ferromagnetic (SAF) layer to ensure that the fixed layer magnetism is fixed. Other fine-tuning layer(s) to improve coupling could also be added, in an embodiment. The first barrier layer material layer 109 includes an insulating tunnel barrier material, such as magnesium oxide, amorphous aluminum oxide, or silicon dioxide, or a combination of one or more thereof. The free layer material layer 110 includes a ferromagnetic material. For example, the free layer material layer 110 may include a metal alloy such as cobalt iron boron (CoFeB). The second barrier layer material layer 111, as with the first barrier layer material layer 109, includes an insulating tunnel barrier material, such as magnesium oxide, amorphous aluminum oxide, or silicon dioxide, or a combination of one or more thereof. Further, the top electrode material layer 185, independently from the bottom electrode material layer 107, may include a conductive metal, such as tantalum, tantalum nitride, or titanium, or a combination of one or more thereof.

Figure 5:
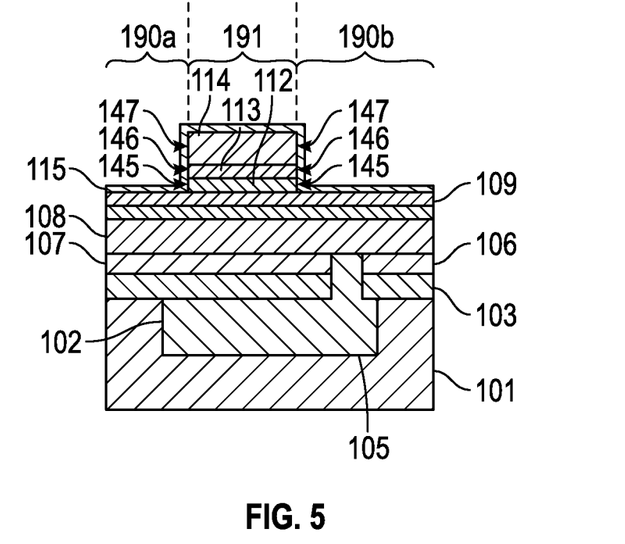

FIG. 5 further depicts the structure that results after the removal of a portion of the free layer material layer 110, a portion of the second barrier layer material layer 111, and a portion of the top electrode material layer 185 illustrated in FIG. 4. That is, as shown in FIG. 5, the remaining portion of each of material layers 110, 111, and 185 form a free layer 112, a second barrier layer 113, and a top electrode 114. The removed portions of material layers 110, 111, and 185 from FIG. 4 are removed from first lateral areas 190a and 190b, as shown in FIG. 5. After such removal, the remaining portion of each of material layers 110, 111, and 185 are in first central area 191, which is positioned between first lateral areas 190a and 190b, as illustrated. As such, the layers 112, 113, and 114 are all overlying the first central area 191 of the material layers 107, 108, and 109. Additionally, an upper surface of the first barrier layer material layer 109 is exposed in areas first lateral 190a and 190b. The removal of the portions of material layers 110, 111, and 185 may be accomplished using any conventional patterning and etching process. For example, a photoresist layer (not separately illustrated) is deposited over the top electrode material layer 185 and then is exposed to an image pattern and treated with a developing solution to form a pattern opening within the photoresist layer. With the photoresist layer thus patterned, the material layers 110, 111, and 185 are etched away in first lateral areas 190a and 190b, leaving the material layers 110, 111, and 185 remaining in first central area 191 to form the layers 112, 113, and 114. The free layer 112, the second barrier layer 113, and the top electrode 114 each have a width 186 in a width direction (the term "width direction" is used herein with respect to a direction that is substantially parallel to an upper surface of the semiconductor substrate of the integrated circuit) that is substantially the same with respect to each such layer 112, 113, and 114. That is, a free layer width, a second barrier layer width, and a top electrode width in the width direction are all substantially equal with respect to one another. Additionally, the free layer 112 has free layer sidewalls 145 at lateral ends thereof, the second barrier layer 113 has second barrier layer sidewalls 146 at lateral ends thereof, and the top electrode 114 has top electrode sidewalls 147 at lateral ends thereof. The sidewalls 145, 146, and 147 each extend in a direction 188 that is generally perpendicular to the above-described width direction, that is, in a direction perpendicular to the upper surface of the semiconductor substrate of the integrated circuit, which is hereinafter referred to as a "sidewall direction." With the widths of the layers 112, 113, and 114 being substantially the same as described above, the sidewalls 145, 146, and 147 are substantially co-planar with one another, as illustrated. FIG. 5 also shows that a first encapsulation layer 115 is formed in-situ with regard to the etch process, for example by conventional conformal deposition processes, over the exposed upper surface of the first barrier layer material layer 109 in first lateral areas 190a and 190b, along the sidewalls 145, 146, and 147, and over the top electrode 114 in first central area 191. The first encapsulation layer 115 includes a dielectric material, such as a silicon nitride material. The first encapsulation layer 115 serves to protect the free layer 112, the second barrier layer 113, and the top electrode 114, in particular the sidewalls 145, 146, and 147 thereof, from subsequent BEOL processes that could damage such layers (or sidewalls), as described above.

Figure 6:
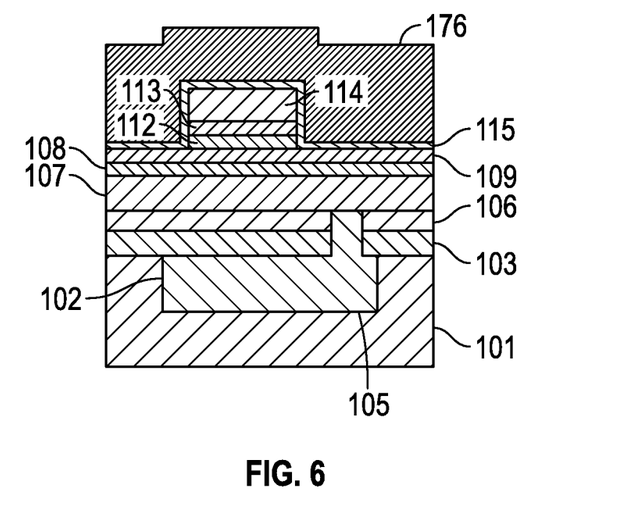

As shown in FIG. 6, a hardmask layer material layer 176 is formed over the first encapsulation layer 115. The hardmask layer material layer 176 is formed of a dielectric material, such as a silicon oxide material, using conventional blanket deposition processes. In this regard, the first encapsulation layer overlies first lateral areas 190a and 190b of the material layers 107, 108, and 109, wherein, as noted above the lateral areas 190a, 190b of these material layers are adjacent to the central area 191 of these material layers. Moreover, the hardmask material layer 176 overlies the first encapsulation layer 115 and the lateral areas 190a, 190b of the material layers 107, 108, and 109.

Figure 7:
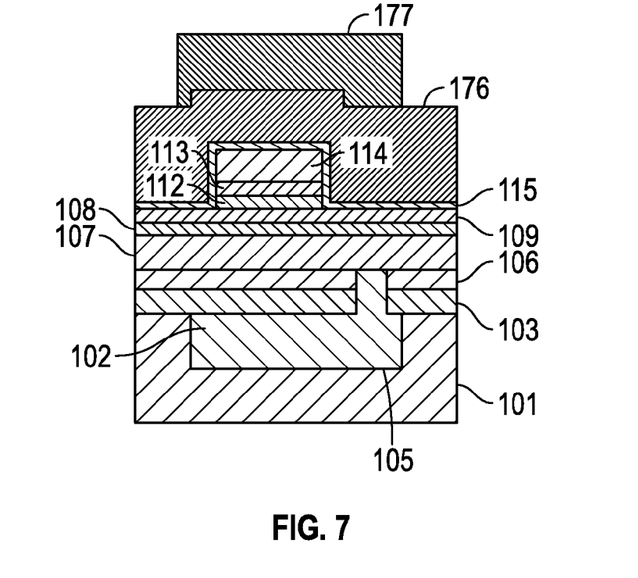
Figure 8:
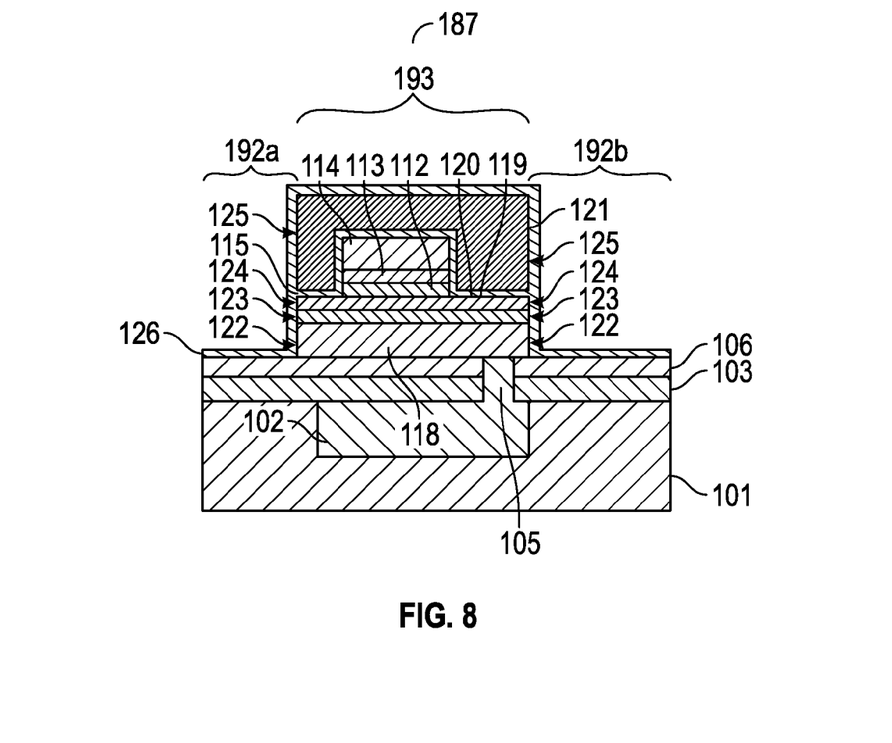

FIGS. 7 and 8 depict the removal of a portion of the bottom electrode material layer 107, a portion of the fixed layer material layer 108, a portion of the first barrier layer material layer 109, a portion of the first encapsulation layer 115, and a portion of the hardmask layer material layer 176. The removal of the portions of material layers 107, 108, 109, 115, and 176 may be accomplished using any conventional patterning and etching process. That is, as shown in FIG. 7, a photoresist layer 177 is deposited over the hardmask layer material layer 176 and then is exposed to an image pattern and treated with a developing solution to form a pattern opening within the photoresist layer 177. With the photoresist layer 177 thus patterned, the material layers 107, 108, 109, 115, and 176 are etched away in second lateral areas 192a and 192b as shown in FIG. 8, leaving the material layers 107, 108, 109, 115, and 176 remaining in second central area 193. The etching thus forms a bottom electrode 118, a fixed layer 119, a first barrier layer 120, and a hardmask layer 121. Additionally, the upper surface of the second ILD layer 106 is exposed in second lateral areas 192a and 192b. The bottom electrode 118, the fixed layer 119, the first barrier layer 120, and the hardmask layer 121 each have a width 187 in the above-described width direction that is substantially the same with respect to each such layer 118, 119, 120, and 121. That is, a bottom electrode width, a fixed layer width, a first barrier layer width, and a hardmask layer width are all substantially equal with respect to one another. As width 187 is wider than width 186 (and conversely, width 186 is narrower than width 187) each of the bottom electrode width, the free layer width, the first barrier layer width, and the hardmask layer width is wider than each of the free layer width, the second barrier layer width, and the top electrode width. The difference in widths 186 and 187, in an embodiment, may be at least about 20%, such as at least about 50%. Additionally, the bottom electrode 118 has bottom electrode sidewalls 122 at lateral ends thereof, the fixed layer 119 has fixed layer sidewalls 123 at lateral ends thereof, the first barrier layer 120 has first barrier layer sidewalls 124 at lateral ends thereof, and the hardmask layer 121 has hardmask layer sidewalls 125 at lateral ends thereof. The sidewalls 122, 123, 124, and 125 each extend in a direction that is generally perpendicular to the above-described width direction, i.e., in the sidewall direction. With the widths of the layers 118, 119, 120, and 121 being substantially the same as described above, the sidewalls 122, 123, 124, and 125 are substantially co-planar with one another, as illustrated. FIG. 8 also shows that a second encapsulation layer 126 is formed, for example by conventional conformal deposition processes, over the exposed upper surface of the second ILD layer 106 in second lateral areas 192a and 192b, along the sidewalls 122, 123, 124, and 125, and over the hardmask layer 121 in second central area 193. The second encapsulation layer 126 includes a dielectric material, such as a silicon nitride material. The second encapsulation layer 126 serves to protect the bottom electrode 118, the fixed layer 119, and the first barrier layer 120, in particular the sidewalls 122, 123, and 124 thereof, from subsequent BEOL processes that could damage such layers (or sidewalls), as described above.

Figure 9:
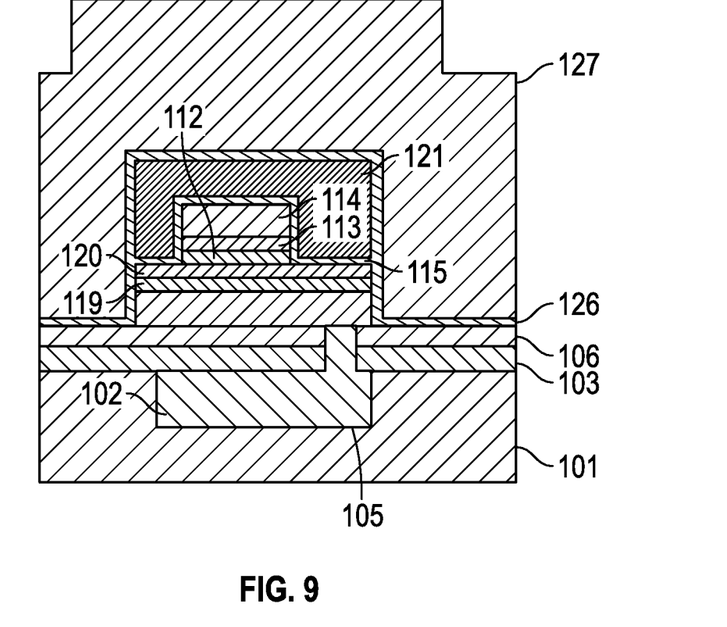

With reference now to FIG. 9, a third ILD layer 127 is formed over the second encapsulation layer 126. The third ILD layer 127, as with first ILD layer 101 and second ILD layer 106, is formed of one or more low-k dielectric materials, USG, silicon nitride, silicon oxynitride, or other commonly used materials. The third ILD layer 127 is formed using conventional deposition techniques, which depend on the particular material employed.

Figure 10:
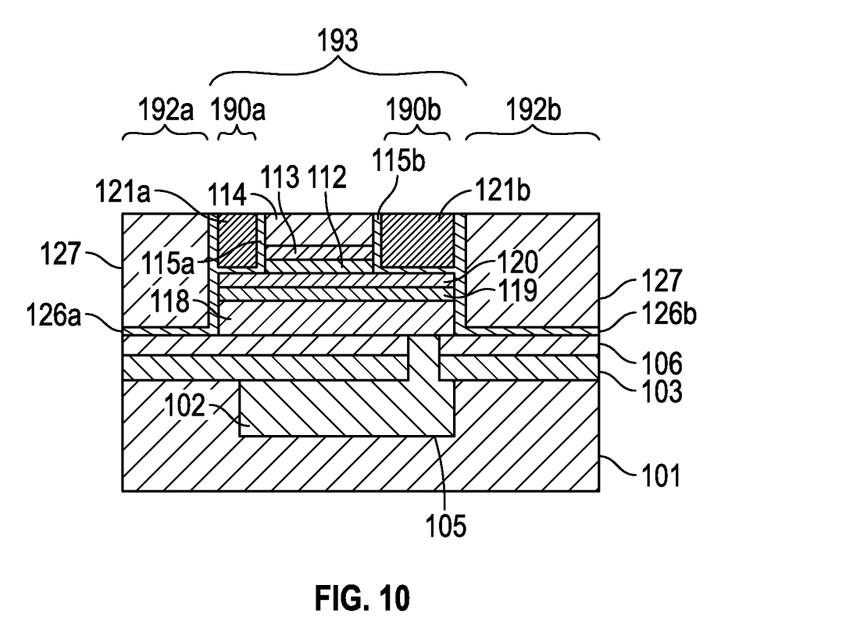

FIG. 10 illustrates the removal of a portion of the second encapsulation layer 126 overlying the hardmask layer 121, a portion of the hardmask layer 121, and a portion of the first encapsulation layer 115 overlying the top electrode 114. This removal may be accomplished using a suitable polishing or planarization technique, such as chemical mechanical polishing. The removal of portions of each of the layers 126, 121, and 115 occurs above an upper surface of the top electrode 114 and within second central area 193. As a result of this polishing or planarization, first encapsulation layer 115 is separated into first encapsulation layer portions 115a and 115b, with portion 115a being disposed over the first barrier layer 120 in first lateral area 190a and along sidewalls 145, 146, and 147 adjacent thereto, and with portion 115b being disposed over the first barrier layer 120 in first lateral area 190b and along sidewalls 145, 146, and 147 adjacent thereto. The second encapsulation layer 126 is separated into second encapsulation layer portions 126a and 126b, with portion 126a being disposed over the second ILD layer 106 in second lateral area 192a and along sidewalls 122, 123, 124, and 125 adjacent thereto, and with portion 126b being disposed over the second ILD layer 106 in second lateral area 192b and along sidewalls 122, 123, 124, and 125 adjacent thereto. The hardmask layer 121 is separated into hardmask layer portions 121a and 121b, with portion 121a being disposed between the first and second encapsulation layer portions 115a, 126a, and with portion 121b being disposed between the first and second encapsulation layer portions 115b, 126b, as illustrated. Furthermore, as a result of this polishing or planarization, upper surfaces of the third ILD layer 127, the hardmask layer portions 121a, 121b, and the top electrode 114 are substantially co-planar with respect to one another. Upper ends of the first encapsulation layer portions 115a, 115b and upper ends of the second encapsulation layer portions 126a, 126b are also co-planar with respect thereto.

Figure 11:
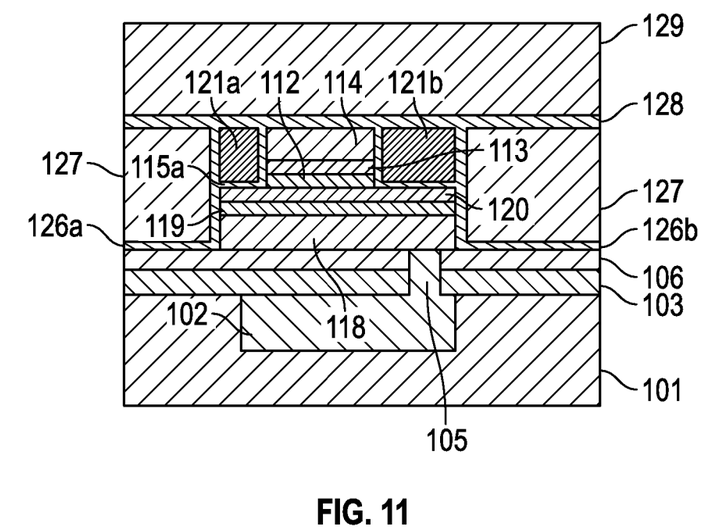

With reference now to FIG. 11, a third encapsulation layer 128 is formed, for example by conventional conformal deposition processes, over the upper surfaces of the third ILD layer 127, the hardmask layer portions 121a, 121b, and the top electrode 114. The third encapsulation layer also connects with the upper ends of the first encapsulation layer portions 115a, 115b and with the upper ends of the second encapsulation layer portions 126a, 126b. The third encapsulation layer 128 includes a dielectric material, such as a silicon nitride material. As further shown in FIG. 9, a fourth ILD layer 129 is formed over the third encapsulation layer 128. The fourth ILD layer 129, as with first ILD layer 101, second ILD layer 106, and the third ILD layer 127 is formed of one or more low-k dielectric materials, USG, silicon nitride, silicon oxynitride, or other commonly used materials. The fourth ILD layer 129 is formed using conventional deposition techniques, which depend on the particular material employed.

Figure 12:
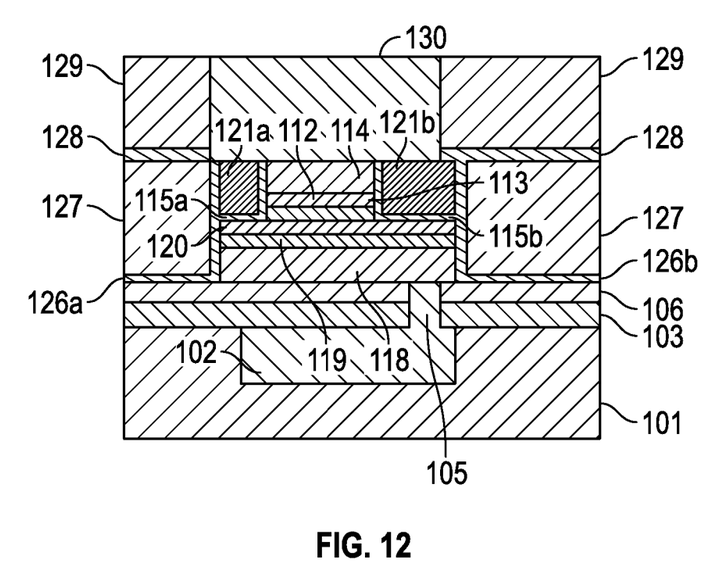

FIG. 12 illustrates the formation of a second metallization layer 130 within the fourth ILD layer 129 and the third encapsulation layer 128. The second metallization layer 130 includes a conductive material compatible with the particular BEOL processes employed. For example, in one embodiment, the second metallization layer 130 includes a copper material. In this embodiment, the second metallization layer 130 is formed using conventional damascene processes. That is, trenches or cavities for the for the second metallization layer 130 are formed in the fourth ILD layer 129 and the third encapsulation layer 128 to expose at least a portion of the top electrode 114. The copper material is then be deposited over the fourth ILD layer 129 to overfill the trenches or cavities, and the excess copper material is removed by polishing (such as chemical mechanical polishing), such that an upper surface of the second metallization layer 130 and an upper surface of the fourth ILD layer 129 are substantially co-planar, as illustrated. In this manner, the second metallization layer 130 becomes electrically connected with the top electrode 114. In another embodiment, the second metallization layer 130 includes a conductive material that does not require damascene processes, such as aluminum. In this embodiment, a layer of an aluminum material may be formed over the fourth ILD layer 129 and then etched into the desired shape of the second metallization layer 130. Additional ILD material is then deposited alongside the second metallization layer 130 resulting in the structure as shown in FIG. 12. Regardless of the material employed, the second metallization layer 130 may be deposited using conventional deposition techniques, such as PVD.

Figure 13:
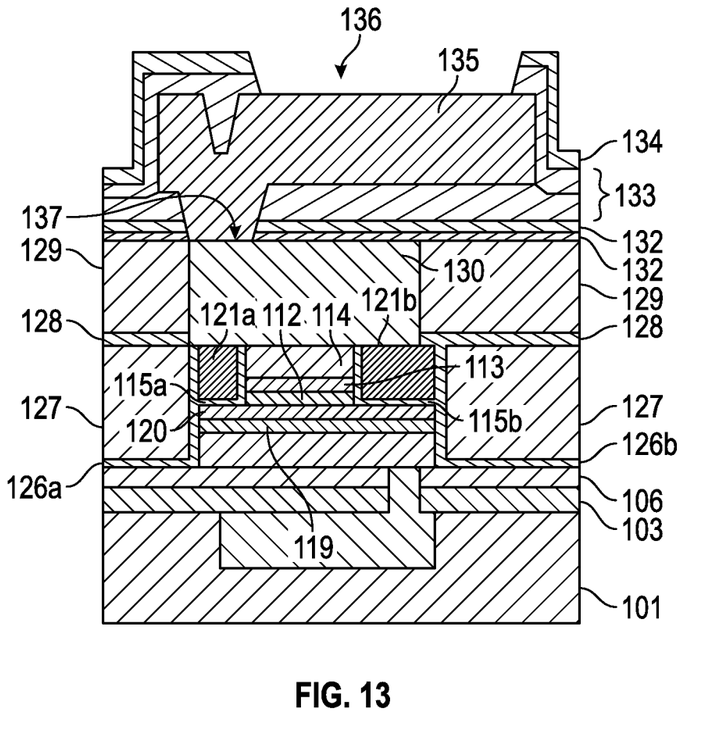

Thereafter, the MRAM structure may be completed by forming conventional interconnect structures and chip-to-chip connection structures. By way of non-limiting illustration, FIG. 13 illustrates interconnection structure 135 electrically connected to the second metallization layer 130 in area 137. Additionally, interconnection structure 135 may include a bonding site 136 for chip-to-chip connection structures (not separately illustrated herein). Interconnection structure 135 may include any suitable conductive material, such as aluminum. Interconnection structure 135 may be otherwise isolated from the second metallization layer 130 of the MRAM structure by one or more diffusion barrier layers 131, one or more passivation layers 132, 134, and one or more dielectric insulation layers 133, each of which may be formed using conventional materials as are known in the art and using conventional processes as are known in the art. The completion of an integrated circuit including the above-described MRAM structures may be accomplished using conventional BEOL processes, and in particular BEOL processes that are suitable for the formation of CMOS logic devices in sub-100 nm design architectures.

Accordingly, disclosed herein are integrated circuits with magnetic random access memory structures and methods for fabricating integrated circuits with magnetic random access memory structures. As described above, the first encapsulation layer 115 serves to protect the free layer 112, the second barrier layer 113, and the top electrode 114, in particular the sidewalls 145, 146, and 147 thereof, from BEOL processes that could damage such layers/sidewalls. Further, the second encapsulation layer 126 serves to protect the bottom electrode 118, the fixed layer 119, and the first barrier layer 120, in particular the sidewalls 122, 123, and 124 thereof, from these BEOL processes. In this manner, the described embodiments provide integrated circuits and methods for fabricating integrated circuits with MRAM structures that are not susceptible (or are less susceptible) to damage during common BEOL processes. In particular, the described integrated circuits and methods for fabricating integrated circuits with MRAM structures are able to be integrated with sub-100 nm CMOS devices.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. An integrated circuit comprising a magnetic random access memory (MRAM) structure, wherein the MRAM structure comprises:
    a bottom electrode that has a bottom electrode width in a width direction and comprises bottom electrode sidewalls that extend in a sidewall direction that is perpendicular to the width direction;
    a fixed layer overlying the bottom electrode, wherein the fixed layer has a fixed layer width in the width direction that is substantially equal to the bottom electrode width in the width direction and comprises fixed layer sidewalls that extend in the sidewall direction;
    a free layer overlying a central area of the fixed layer, wherein the free layer has a free layer width in the width direction that is narrower than the bottom electrode width in the width direction and comprises free layer sidewalls that extend in the sidewall direction;
    a top electrode overlying the free layer, wherein the top electrode has a top electrode width in the width direction that is substantially equal to the free layer width in the width direction and comprises top electrode sidewalls that extend in the sidewall direction;
    a first encapsulation layer disposed along the free layer sidewalls and the top electrode sidewalls, wherein the first encapsulation layer overlies lateral areas of the fixed layer, and wherein the lateral areas of the fixed layer are adjacent to the central area of the fixed layer;
    a second encapsulation layer disposed along the bottom electrode sidewalls and the fixed layer sidewalls;
    a first tunnel barrier layer disposed between the fixed layer and the free layer, wherein the first tunnel barrier layer has a first tunnel barrier layer width in the width direction that is substantially equal to the bottom electrode width in the width direction, wherein the first tunnel barrier layer comprises first tunnel barrier layer sidewalls that extend in the sidewall direction, and wherein the second encapsulation layer is disposed along the first tunnel barrier layer sidewalls; and
    a second tunnel barrier layer disposed between the free layer and the top electrode, wherein the second tunnel barrier layer has a second tunnel barrier layer width in the width direction that is substantially equal to the free layer width in the width direction, wherein the second tunnel barrier layer comprises second tunnel barrier layer sidewalls that extend in the sidewall direction, and wherein the first encapsulation layer is disposed along the second tunnel barrier layer sidewalls.

2. The integrated circuit of claim 1, further comprising a hardmask layer that overlies the first encapsulation layer and the lateral areas of the fixed layer, wherein the hardmask layer comprises hardmask layer sidewalls that extend in the sidewall direction.

3. The integrated circuit of claim 2, wherein the second encapsulation layer is disposed along the hardmask layer sidewalls.

4. The integrated circuit of claim 1, further comprising a first metallization layer that is electrically connected to the bottom electrode.

5. The integrated circuit of claim 4, further comprising a passivation layer disposed between the first metallization layer and the bottom electrode.

6. The integrated circuit of claim 5, further comprising an interlayer dielectric layer between the passivation layer and the bottom electrode.

7. The integrated circuit of claim 1, further comprising a second metallization layer that is electrically connected to the top electrode.

8. A method for fabricating a magnetic random access memory (MRAM) structure of an integrated circuit comprising:
    forming a bottom electrode material layer;
    forming a fixed layer material layer over the bottom electrode material layer;
    forming a free layer material layer over the fixed layer material layer;
    forming a top electrode material layer over the fixed layer material layer;
    removing the free layer material layer and the top electrode material layer from first lateral areas to form a free layer that has a free layer width in a width direction and that comprises free layer sidewalls that extend in a sidewall direction that is perpendicular to the width direction and a top electrode that has a top electrode width in the width direction that is substantially equal to the free layer width in the width direction and that comprises top electrode sidewalls that extend in the sidewall direction;
    forming a first in-situ encapsulation layer along the free layer sidewalls and the top electrode sidewalls and over the top electrode;
    subsequent to forming the first encapsulation layer, removing the bottom electrode material layer and the fixed layer material layer from second lateral areas to form a bottom electrode that has a bottom electrode width in the width direction that is wider than the free layer width in the width direction and that comprises bottom electrode sidewalls that extend in the sidewall direction and a fixed layer that has a fixed layer width in the width direction that is substantially equal to the bottom electrode width in the width direction and that comprises fixed layer sidewalls that extend in the sidewall direction;

forming a second in-situ encapsulation layer along the bottom electrode sidewalls and the fixed layer sidewalls;

forming a first tunnel barrier layer material layer between the fixed layer material layer and the free layer material layer and, subsequent to forming the first encapsulation layer, removing the first tunnel barrier layer material layer from the second lateral areas to form a first tunnel barrier layer that has a first tunnel barrier layer width in the width direction that is substantially equal to the bottom electrode width in the width direction and comprises first tunnel barrier layer sidewalls that extend in the sidewall direction, and wherein forming the second encapsulation layer comprises forming the second encapsulation layer along the first tunnel barrier layer sidewalls;

forming a second tunnel barrier layer material layer between the free layer material layer and the top electrode material layer and, prior to forming the first encapsulation layer, removing the second tunnel barrier layer material layer from the first lateral areas to form a second tunnel barrier layer that has a second tunnel barrier layer width in the width direction that is substantially equal to the free layer width in the width direction and that comprises second tunnel barrier layer sidewalls that extend in the sidewall direction, and wherein forming the first encapsulation layer comprises forming the first encapsulation layer along the second tunnel barrier layer sidewalls.

9. The method of claim 8, further comprising forming a hardmask layer material layer over the first encapsulation layer and removing the hardmask layer material layer from the second lateral areas to form a hardmask layer that has a hardmask layer width in the width direction that is substantially equal to the bottom electrode width in the width direction and that comprises hardmask layer sidewalls that extend in the sidewall direction, and wherein forming the second encapsulation layer comprises forming the second encapsulation layer along the hardmask layer sidewalls and over the hardmask layer.

10. The method of claim 9, further comprising planarizing the first encapsulation layer, the hardmask layer, and the second encapsulation layer to remove a portion of the second encapsulation layer overlying the hardmask layer from, a portion of the hardmask layer, and a portion of the first encapsulation layer overlying the top electrode.

11. The method of claim 8, further comprising forming a first metallization layer in electrical connection with the bottom electrode.

12. The method of claim 11, further comprising forming a passivation layer between the first metallization layer and the bottom electrode.

13. The method of claim 12, further comprising forming an interlayer dielectric layer between the passivation layer and the bottom electrode.

14. The method of claim 8, further comprising forming a second metallization layer in electrical connection with the top electrode.

* * * * *